(12) United States Patent
Di Gregorio et al.

(10) Patent No.: US 11,284,511 B2
(45) Date of Patent: Mar. 22, 2022

(54) COMPONENT CARRIER WITH DIFFERENT SURFACE FINISHES AND METHOD FOR MANUFACTURING THE SAME

(71) Applicant: AT&S Austria Technologie & Systemtechnik Aktiengesellschaft, Leoben (AT)

(72) Inventors: Giordano Di Gregorio, Shanghai (CN); Seok Kim (Annie) Tay, Singapore (SG); Karl Wang, Shanghai (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/190,976

(22) Filed: Nov. 14, 2018

(65) Prior Publication Data

US 2019/0174626 A1    Jun. 6, 2019

(30) Foreign Application Priority Data

Nov. 15, 2017    (CN) .......................... 201711132876.1

(51) Int. Cl.
*H05K 1/18*  (2006.01)
*H05K 1/09*  (2006.01)
(Continued)

(52) U.S. Cl.
CPC .............. *H05K 1/09* (2013.01); *H05K 3/067* (2013.01); *H05K 3/22* (2013.01); *H05K 1/181* (2013.01);
(Continued)

(58) Field of Classification Search
CPC ............ H05K 1/09; H05K 1/181; H05K 3/22; H05K 2201/0338; H05K 2201/0391
See application file for complete search history.

(56) References Cited

U.S. PATENT DOCUMENTS

2005/0067378 A1* 3/2005 Fuerhaupter .............. C23F 1/18
216/34
2005/0258522 A1* 11/2005 En ............................ C23G 1/10
257/670
(Continued)

FOREIGN PATENT DOCUMENTS

| CN | 205726641 U | 11/2016 |
|---|---|---|
| DE | 3639604 A1 | 5/1988 |
| JP | H0513934 A | 1/1993 |

OTHER PUBLICATIONS

Office Action in Application No. 201711132876.1; China National Intellectual Property Administration; pp. 1-8; dated Dec. 31, 2020; No. 6, Xitucheng Lu, Jimenqiao Haidian District, Beijing City, 100088, China.
(Continued)

*Primary Examiner* — Binh B Tran
(74) *Attorney, Agent, or Firm* — Robert A. Blaha; Smith Tempel Blaha LLC

(57) ABSTRACT

A component carrier and a method for manufacturing the same are disclosed. The component carrier includes an electrically conductive layer structure and an overhanging end. A first surface finish is formed on a first surface portion of the electrically conductive layer structure. Furthermore, the component carrier further includes a second surface finish on a second surface portion of the electrically conductive layer structure connected to the first surface finish and extending under the overhanging end.

20 Claims, 7 Drawing Sheets

(51) Int. Cl.
*H05K 3/22* (2006.01)
*H05K 3/06* (2006.01)

(52) U.S. Cl.
CPC ..... *H05K 1/182* (2013.01); *H05K 2201/0338* (2013.01); *H05K 2201/0379* (2013.01); *H05K 2201/0391* (2013.01); *H05K 2203/072* (2013.01)

(56) References Cited

U.S. PATENT DOCUMENTS

| | | | |
|---|---|---|---|
| 2008/0296051 A1* | 12/2008 | Yamaguchi | H05K 1/118 174/257 |
| 2011/0284277 A1* | 11/2011 | Kato | H05K 1/113 174/258 |
| 2012/0181691 A1 | 7/2012 | Duh et al. | |
| 2015/0062851 A1* | 3/2015 | Shimizu | H05K 1/115 361/767 |
| 2016/0005683 A1 | 1/2016 | Liu | |
| 2017/0079133 A1* | 3/2017 | Carlson | H05K 1/0298 |
| 2019/0174626 A1 | 6/2019 | Di Gregorio et al. | |

OTHER PUBLICATIONS

Office Action in Application No. 201711132876.1 (English Translation); China National Intellectual Property Administration; pp. 1-3; Dec. 31, 2020; No. 6, Xitucheng Lu, Jimenqiao Haidian District, Beijing City, 100088, China.

* cited by examiner

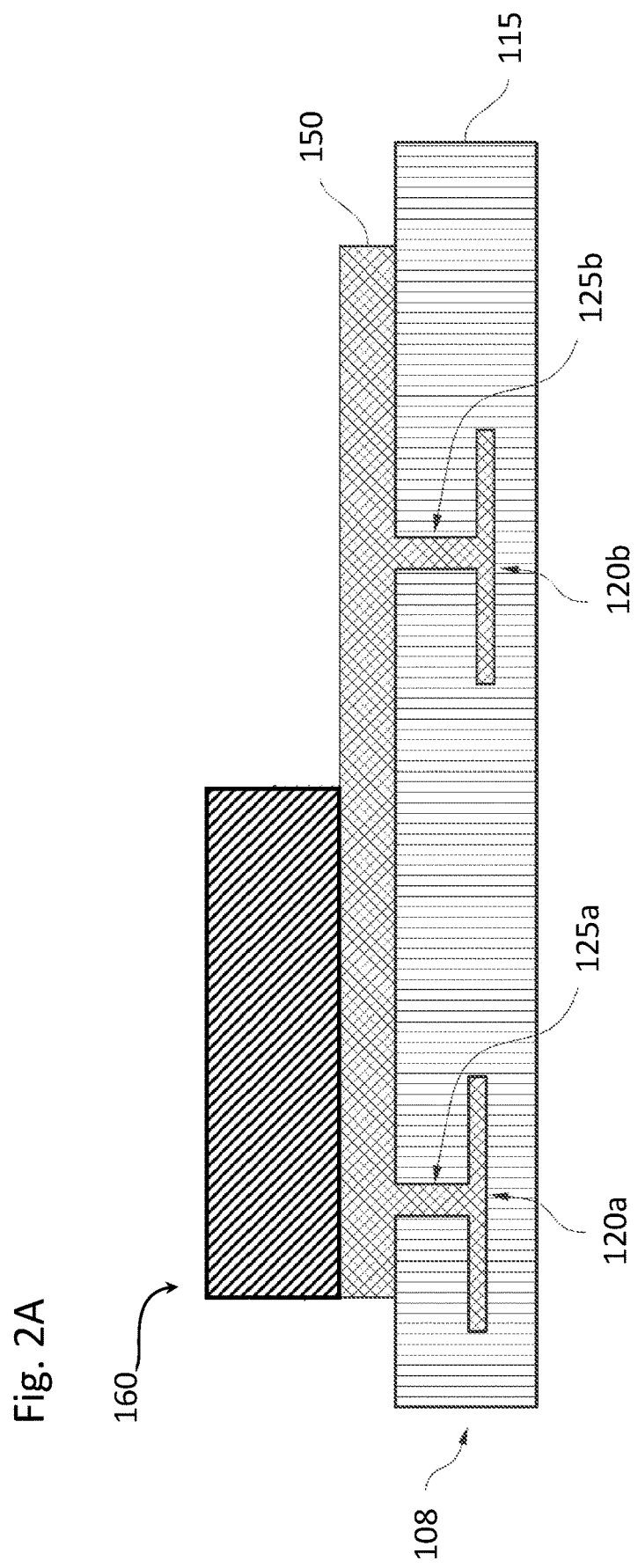

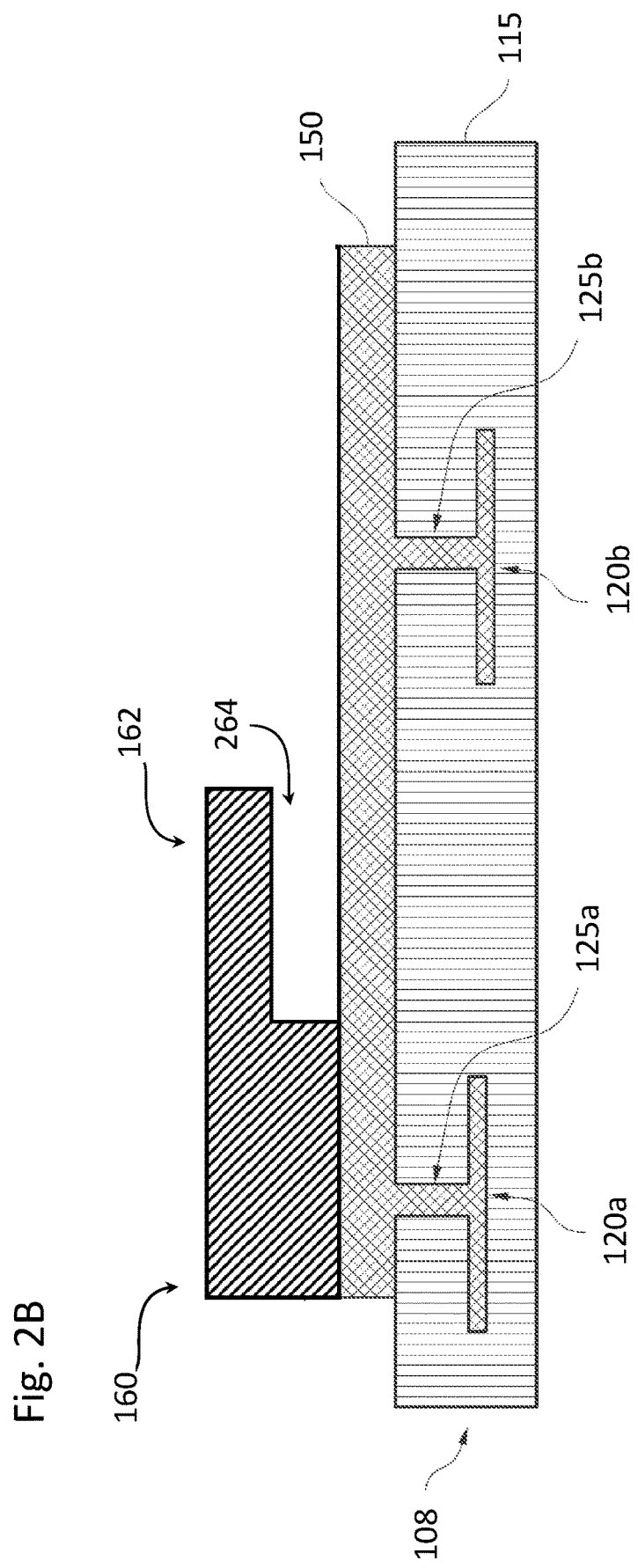

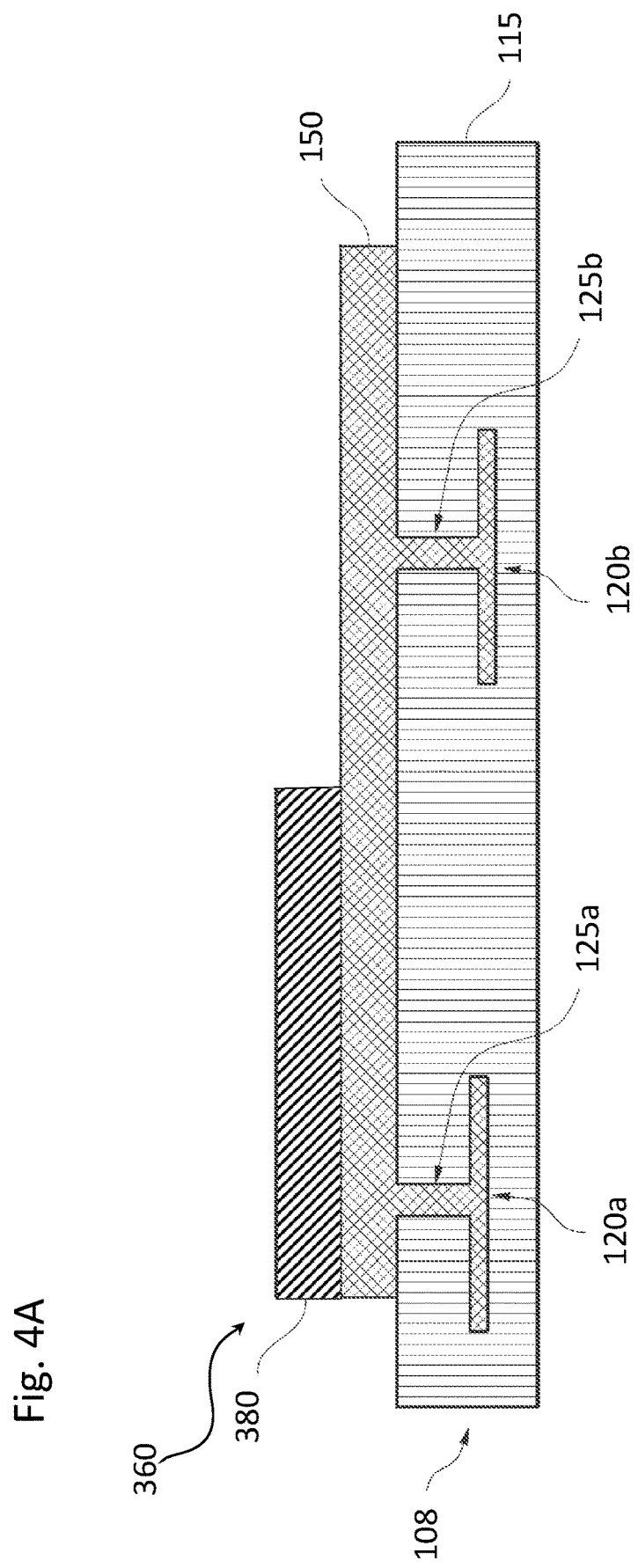

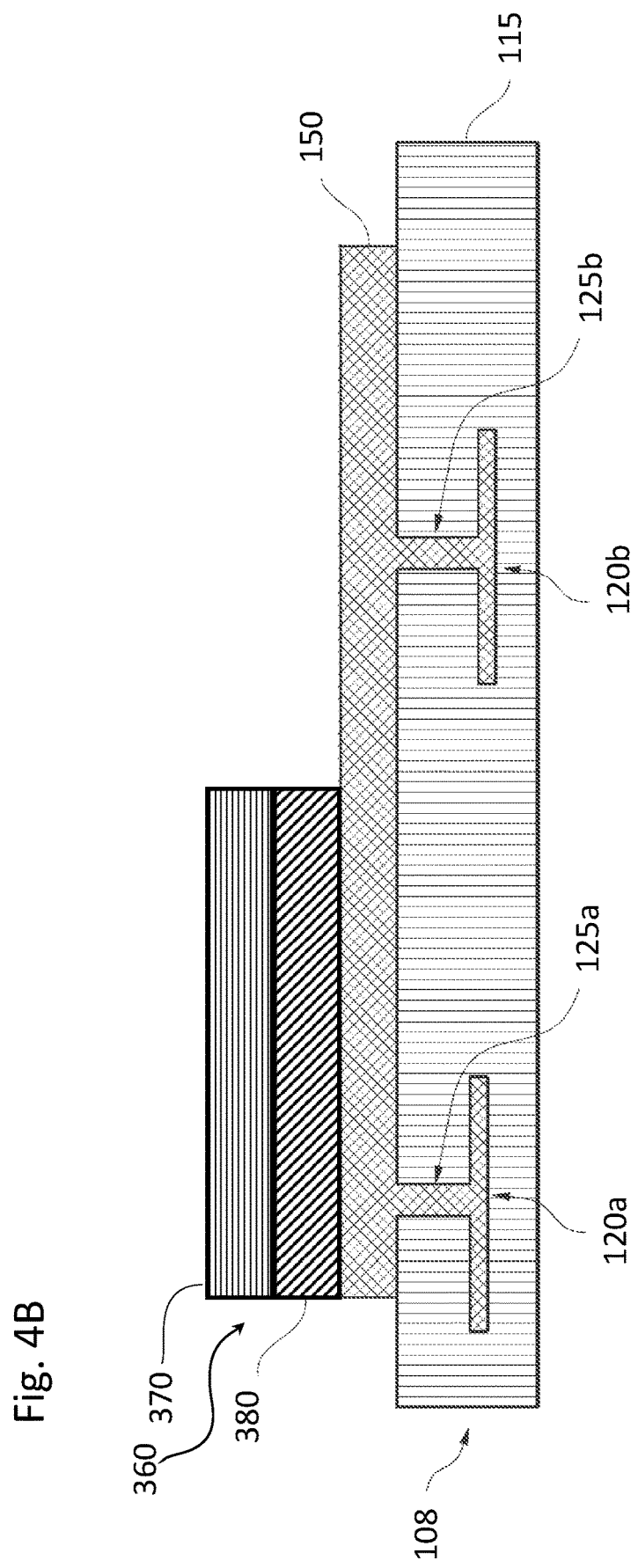

COMPONENT CARRIER WITH DIFFERENT SURFACE FINISHES AND METHOD FOR MANUFACTURING THE SAME

CROSS-REFERENCE TO RELATED APPLICATIONS

This application claims the benefit of the filing date of the Chinese Patent Application No. 201711132876.1 filed 15 Nov. 2017, the disclosure of which is hereby incorporated by reference.

TECHNICAL FIELD

The invention relates to a component carrier, such as a printed circuit board or a substrate, and a method for manufacturing the same.

TECHNOLOGICAL BACKGROUND

A component carrier, such as a printed circuit board (PCB) or a substrate, mechanically supports and electrically connects electronic components. Electronic components are mounted on the component carrier and are interconnected to form a working circuit or electronic assembly.

Component carriers can be single sided or double-sided component carriers or can have a multi-layer design. Advantageously, multi-layer component carriers allow a high component density which with ongoing miniaturization efforts in electronic components is becoming increasingly more important. Conventional component carriers known from the state of the art comprise a laminated stack with a plurality of electrically insulating layer structures and a plurality of electrically conductive layer structures. The electrically conductive layers are usually connected to each other by so called microvias or plated-through holes. A conductive copper layer on the surface of the laminated stack forms an exposed structured copper surface. The exposed structured copper surface of the laminated stack is usually covered with a surface finish which completely covers the exposed structured copper surface.

To provide versatile component carriers capable of carrying electronic components of different types which may be attached to the component carrier by different methods, it is advantageous when the exposed copper surface of the laminated stack is not only covered by a single surface finish but by at least two surface finishes, i.e. a first surface finish for a first portion of the exposed copper surface and a second surface finish for a second portion of the exposed copper surface.

However, due to inaccuracies in the plating process of a first surface finish and a second surface finish the creation of a non-covered gap between the surface finishes, which is prone to oxidation, may occur.

Another problem arises with component carriers which have an exposed copper surface of the laminated stack covered by at least two surface finishes. When the component carrier is subjected to mechanical stress, the interface of a first surface finish and a second surface finish is susceptible to decomposition, for instance by delamination.

SUMMARY

Therefore, there may be a need for improved component carriers which are oxidation resistant and mechanically robust.

This need may be met by the subject matter according to the independent claims. Advantageous embodiments of the present invention are described by the dependent claims.

According to a first aspect of the invention, a component carrier is provided with (a) an electrically conductive layer structure; (b) a first surface finish formed on a first surface portion of the electrically conductive layer structure and having an overhanging end (for instance, after a follow-up micro-etching process) and (c) a second surface finish on a second surface portion of the electrically conductive layer structure is connected to the first surface finish and extends under the overhanging end.

According to a second aspect of the invention, a method of manufacturing a component carrier is provided. The method includes: (a) forming a first surface finish on a first surface portion of an electrically conductive layer structure; (b) forming an overhanging end of the first surface finish by removing material of the first surface finish (for instance forming an overhanging end of the first surface finish by follow-up micro-etching procedure for oxidation removal); and (c) forming a second surface finish on a second surface portion of the electrically conductive layer structure, the second surface finish connected to the first surface finish and extending under the overhanging end.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

The overhanging end of the first surface finish defines a cavity between the first surface finish and the electrically conductive layer structure which is filled or can be filled with the second surface finish. Due to the overhanging end of the first surface finish, the interaction surface of the first surface finish and the second surface finish is enlarged compared to the case where a first surface finish and a second surface finish are positioned adjacent to each other in the absence of any overhanging end, i.e. a contact being established only in a sideward way. Therefore the inventive architecture with the overhanging end of the first surface finish under which the second surface finish at least partly extents avoids delamination of the first surface finish and the second surface finish, a decomposition and gap formation at the interface of the two surface finishes.

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In the context of the present invention, the term "layer structure" may be a single layer or multilayer assembly.

In the present document, the term "overhanging end" denotes a portion of the first surface finish standing out from the rest of the first surface finish in such a way that no contact is made by the overhanging end to the electrically conductive layer structure. The portion of the component carrier extending under the overhanging end may be filled, in particular filled with a second surface finish.

According to an exemplary embodiment of the invention, the second surface finish connects to a roughened surface, particularly to an etched surface of the first surface finish.

In particular, the second surface finish connects to a roughened surface of a cavity formed by the overhanging end of the first surface finish.

The formation of the overhanging end, i.e. the cavity formation in the first surface finish, may be carried by mechanical or chemical processes, preferably by an etching process.

In one exemplary embodiment, a follow-up micro-etching procedure is applied. Such a follow-up micro-etching procedure has the additional advantage that the surface is further roughened and at the same time oxidation products on the surface may be removed efficiently.

In a preferred embodiment, the roughened surface of the first surface finish has at least partially, preferably over the whole area which the second surface finish connects to, a mean roughness (Ra) of 0.1 μm (micrometer) to 3 μm (micrometer), in particular 0.1 μm (micrometer) to 1 μm (micrometer).

The Mean Roughness (Roughness Average Ra) is the arithmetic average of the absolute values of the roughness profile ordinates. Ra is known to a skilled person as surface roughness measure commonly adopted in general engineering practice. It gives a suitable general description of the height variations in the surface. The units of Ra are micrometers.

Preferably, the Mean Roughness with respect to the z direction is calculated as:

$$R_a = \frac{1}{MN}\sum_{m=1}^{M}\sum_{n=1}^{N}|z(x_m, y_n) - \langle z \rangle|$$

with M times N being the total number of evaluation points. The mean value in z direction, i.e. $\langle z \rangle$, is defined as:

$$\langle z \rangle = \frac{1}{MN}\sum_{m=1}^{M}\sum_{n=1}^{N}z(x_m, y_n)$$

With M and N and thereby the number of evaluation points becoming infinite, the sum signs in the equations above transform into the corresponding integrals. With respect to the present invention, the roughened surface of the first surface finish is preferably chosen as the x-y plane within the meaning of the above equations.

Such a roughened surface provides has an enlarged interaction area due to the presence of tiny surface recesses. Therefore, the interaction surface of the first surface finish and the second surface finish is not only enlarged due to the presence of the overhanging end itself, i.e. the presence of the cavity alone, as it would be the case for the fully planar cavity surface. Additionally, the surface area of the first surface finish which the second surface finish can be connected to is multiplied by the presence of the tiny surface recesses which are present in the roughened surface, in particular in a roughened surface obtained by an etching process. Therefore, the strength of the connection to the first surface finish by the second surface finish in the area of the overhanging end, i.e. the bond between the second surface finish and the surface of the cavity, is strongly enhanced.

Applying an etching solution not only results in removing material from the first surface finish thereby forming an overhanging end defining a cavity but at the same time leaves the surface of the cavity in a roughened state. Therefore, an additional technical advantage arises from fact, that both, the overhanging end and the provision of roughened surface can be achieved in a single step. Hence, the embodiment of the invention described does not only provide an enhanced connection or bond between the first surface finish and the second surface finish but such an enhanced connection can be realized in a simple and cost efficient way.

In one exemplary embodiment, formation of an overhanging end is carried out by mechanical methods, for instance abrasive techniques. Preferably, in addition, the surface of the first surface finish defining the overhanging end, i.e. the surface of the formed cavity, is then roughened by a follow-up micro-etching procedure. This two-step process of mechanical cavity formation and an additional etching process has the additional advantage that the surface is roughened and at the same time oxidation products may be removed efficiently.

According to an exemplary embodiment of the invention, the first surface finish comprises:

(a) a first layer structure arranged above the electrically conductive layer structure; and (b) a second layer structure arranged above the first layer structure.

According to an exemplary embodiment of the invention, the first layer structure and/or the second layer structure comprise at least one from the group consisting of nickel, palladium, platinum, gold, copper, tungsten.

According to an exemplary embodiment of the invention, the chemical composition of the first layer structure and the chemical composition of the second layer structure differ.

Such an embodiment allows for providing a first layer structure with a chemical composition, which is removable more easily than a chemical composition of the second layer structure. Therefore, the presence of the first layer structure and the second layer structure with different chemical compositions allow for a selective removal of material of the first layer structure resulting in a well-defined overhanging end.

In particular, the described embodiment provides a first layer structure with a chemical composition which is removable by chemical etching, while the chemical composition of a second layer structure is less removable or not removable by chemical etching. Therefore, applying an etching process in the manufacturing of the component carrier allows for a selective removal of material of the first layer structure of the first surface finish, while the second layer structure is basically left intact. Providing a second layer structure of a chemical composition, which is less removable by chemical etching, means that the chemical composition of the second layer structure is such that it is left basically intact in the etching process. However, this does not exclude that the second layer structure of the first surface finish is prone to a superficial etching leaving the surface of the second layer structure at least partially in a roughened state.

According to an exemplary embodiment of the invention, the first layer structure comprises nickel or a palladium/nickel alloy and the second layer structure comprises palladium or a palladium/nickel alloy.

In particular, by adjusting the amount of nickel in the chemical composition of the first layer structure and the amount of palladium and/or nickel in the chemical composition of the second layer structure, the extent of etchability of the first layer structure relative to the etchability of the second layer structure can be adjusted. In particular, the amount of nickel and/or palladium in the chemical composition of the first layer structure and the amount of palladium and/or nickel in the chemical composition of the second layer structure are in such a way that the etchability of the first layer structure is larger than the etchability of the second layer structure, thereby creating a well-defined cavity which can subsequently be filled with the second surface finish.

In particular, the amount of nickel in the chemical composition of the first layer structure and the amount of palladium and/or nickel in the chemical composition of the second layer structure may be adjusted to allow for a selective removal of material of the first layer structure, in particular, by an etching process while the second layer structure is basically left intact but with the surface of the second layer structure being at least partially in a roughened state.

The roughening of the surface may for instance also be established by a follow-up micro-etching procedure. Such a two-step process has the additional advantage that the surface is roughened and at the same time oxidation products on the surface may be removed efficiently.

In particular, the palladium/nickel alloy comprises nickel and palladium in relative amounts (wt.-%) of 60:40 to 95:5, preferably 70:30 to 90:10. This does not exclude the possibility that in addition to nickel and palladium other components are contained in the palladium/nickel alloy. In an exemplary embodiment, the total amount of both, nickel and palladium, in the palladium/nickel alloy is at least 90 wt.-%.

In one exemplary embodiment, the palladium/nickel alloy comprises an amount of nickel in a range of 70 wt.-% to 90 wt.-% and an amount of palladium of at least 10 wt.-%.

In one exemplary embodiment, the palladium/nickel alloy comprises an amount of nickel of at least 70 wt.-% and an amount of palladium in the range of 10 wt.-% to 30 wt.-%.

According to an exemplary embodiment of the invention, the second surface finish comprises at least one from the group consisting of organic solderability preservative component, nickel, palladium, platinum, gold, copper.

In particular, the second surface finish is obtainable by the method of organic solderability preservative and the second surface finish comprises an organic solderability preservative component.

Organic solderability preservative (OSP) is a method for coating of printed circuit boards. In the context of the present invention, the term "organic solderability preservative" is also used for the organic compounds used in said methods.

Due to its chemical structure, the organic solderability preservative can form a coordination bond to a metal surface which preferably is a metal-nitrogen heteroatomic bond. Therefore, the organic solderability preservative component can reliably bind to a metal surface, in particular a metal surface comprising nickel, palladium, platinum, gold or copper.

In particular the organic solderability preservative component can reliably connect to the surface of the first surface finish formed by the overhanging end. A particularly reliable connection can be established between the organic solderability preservative component and a roughened surface of the first surface finish formed by the overhanging end.

Further, the OSP process is environmentally friendly, provides a surface planarity equivalent to the plated copper and requires very low equipment maintenance. Further, the coating thickness can be controlled by solution concentration, pH, temperature, and dwell time. Since all variables can be held at controlled levels, process variation can be minimized.

According to an exemplary embodiment of the invention, the organic solderability preservative component is an azole.

Due to its chemical structure, the organic solderability preservative being an azol can form a particularly strong coordination bond to a metal, i.e. a metal-nitrogen heteroatomic bond. Therefore, the organic solderability preservative component can even more reliably bind to a metal surface, in particular a metal surface comprising nickel, palladium, platinum, gold or copper.

According to an exemplary embodiment of the invention, the azole is one from the group consisting of benzotriazoles, imidazoles, benzimidazoles.

According to an exemplary embodiment of the invention, the removing of material of the first surface finish comprises an etching process.

According to an exemplary embodiment of the invention, the first surface finish comprises a first and a second layer structure and the etching process is an etching process selectively removing material of the first layer structure of the first surface finish.

According to an exemplary embodiment of the invention, the etching process comprises the application of an etching composition comprising $H_2O_2$ (hydrogen peroxide) and $H_2SO_4$ (sulfuric acid).

According to an exemplary embodiment of the invention, the component carrier further comprises a component, in particular an electronic component, mounted on and/or embedded in at least one electrically insulating layer structure and/or the at least one electrically conductive layer structure.

According to an exemplary embodiment of the invention, the component carrier is shaped as a plate.

According to an exemplary embodiment of the invention, the component carrier is configured as one of the group consisting of a printed circuit board, and a substrate.

According to an exemplary embodiment of the invention, the component carrier is configured as a laminate-type component carrier.

In an exemplary embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an exemplary embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an exemplary embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an exemplary embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an exemplary embodiment, the component carrier is a laminate-type component carrier. In such an embodiment, the component carrier is a compound of multiple layer structures which are stacked and connected together by applying a pressing force, if desired accompanied by heat.

Layer structures of the component carrier may be formed by an electroless nickel plating (EN), in particular layer structures of the first surface finish and/or the second surface finish, more particular the first layer structure of the first surface finish and/or the second layer structure of the first surface finish.

Electroless nickel plating is a technique for nickel layer deposition. Electroless plating technologies take advantage of an autocatalytic reaction in order to deposit a coating on the surface of a component carrier, such as the surface of a PCB or of a substrate. Electroless nickel plating may exhibit advantages over conventional plating methods as electroless plating technologies do not require an electric current to pass through the solution to form a deposit and are therefore free from flux-density and power supply issues. Thus, providing an even and well-defined surface finish. Not only nickel but also other metals, in particular palladium and platinum, can be plated by electroless technologies.

In electroless nickel plating, a reducing agent, such as sodium hypophosphite ($NaPO_2H_2.H_2O$), reacts with nickel metal ions to deposit metal. In electroless nickel plating, preferably alloys with different percentage of phosphorus are employed. Different amounts of phosphorous may result in different properties of the deposited layer.

The EN plating is usually classified into low phosphorus, medium phosphorous and high phosphorous treatment according to the amount of phosphorous in the deposited layer.

Low phosphorus treatment offers a very uniform thickness which eliminates grinding after plating. Further it provides for excellent corrosion resistance in alkaline environments. The amount of phosphorous is typically below 4 wt.-% of phosphorous in the deposited layer.

Medium phosphorus electroless nickel (MPEN) treatment is referred to when the nickel-phosphorus alloy deposited by an electroless/autocatalytic process in which the resulting alloy consists of medium levels of phosphorus. The range of phosphorous is from about 6 to about 10 wt.-% of phosphorous in the deposited layer.

High Phosphorus electroless nickel treatment offers high corrosion resistance and protection from acidic environments ensuring very little surface porosity. The amount of phosphorous is above 10 wt.-% of phosphorous in the deposited layer.

The EN bath is typically composed of a nickel source, for instance nickel sulfate, and a reducing agent, such as sodium hypophosphite. The EN bath may further comprise at least one complexing agent, e.g. for increasing phosphite solubility, and/or at least one stabilizer and/or at least one buffering agent and/or at least one brightener and/or at least one surfactant and/or at least one accelerator. Advantageously, the EN treatment is such that is provides a high speed deposit rate.

In the context of the present invention an electroless nickel layer with a phosphorus content in a range of 0.1 wt.-% to 13 wt.-%, more preferred with a phosphorus content in a range of 0.5 wt.-% to 10 wt.-%, and even more preferred with a phosphorus content in a range of 3 wt.-% to 7 wt.-% may be employed. The preferred treatment for obtaining an electroless nickel layer is a medium phosphorus electroless nickel treatment.

It is established in the state of the art that electroless nickel/immersion Gold (ENIG) has excellent solderability properties and forms high reliability wire bonds effectively preventing oxidation issues. Further, it is established in the state of the art that electroless nickel/electroless palladium/immersion Gold (ENEPIG) has good solderability for Sn—Ag—Cu based solders and forms high reliability wire bonds. Therefore, for realizing the component carrier described in this document known and well established procedures can be employed. As a consequence, the described component carrier can be realized in a technologically easy and reliable manner.

The first and/or second surface finish may be formed by an ENIG or ENEPIG process. In the context of the present invention, the ENEPIG process can be advantageously used for providing a first surface finish with a first layer structure comprising nickel and a second layer structure comprising palladium. A subsequent etching process may be used for a selective removal of nickel of the first layer structure of the first surface finish while the second layer structure is basically left intact resulting in a rough surface of the cavity formed by surface portions of the second layer structure, the electrically conductive layer structure and the first layer structure.

By an ENEPIG technology a nickel layer and a palladium layer are formed by two electroless plating steps. The first and/or the second surface finish may alternatively comprise a single Ni—Pd alloy layer. Particularly, the Ni—Pd alloy layer can be formed by electroplating, and thus the manufacturing time can be reduced.

As an organic solderability preservative component an azole may be used. Azoles within the meaning of the invention are compounds with a five-membered heterocycle with a nitrogen atom and preferably at least one additional other non-carbon atom, in particular nitrogen, sulfur, or oxygen as part of the ring. One lone pair of electrons from each heteroatom in the ring is part of the aromatic bonding of the azole. The azol may preferably be at least one of the group consisting of benzotriazoles, imidazoles, benzimidazoles.

The first surface finish and the second surface finish each may have a thickness in a range of 1 nm (nanometer) to 200 μm (micrometer), more preferred in a range of 5 nm to 150 μm and even more preferred in a range of 10 nm to 100 μm or in a range of 10 nm to 50 μm.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless otherwise notified, in addition to any combination of features belonging to one type of subject matter also any combination between features relating to different subject matters, in particular between features of the method type claims and features of the apparatus type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

BRIEF DESCRIPTION OF THE DRAWINGS

FIGS. 2A and 2B illustrate a method for manufacturing the component carrier of FIG. 1 according to an embodiment of the invention.

FIGS. 4A, 4B and 4C illustrate a method for manufacturing the component carrier of FIG. 3 according to an embodiment of the invention.

DETAILED DESCRIPTION OF ILLUSTRATED EMBODIMENTS

Figure 1:
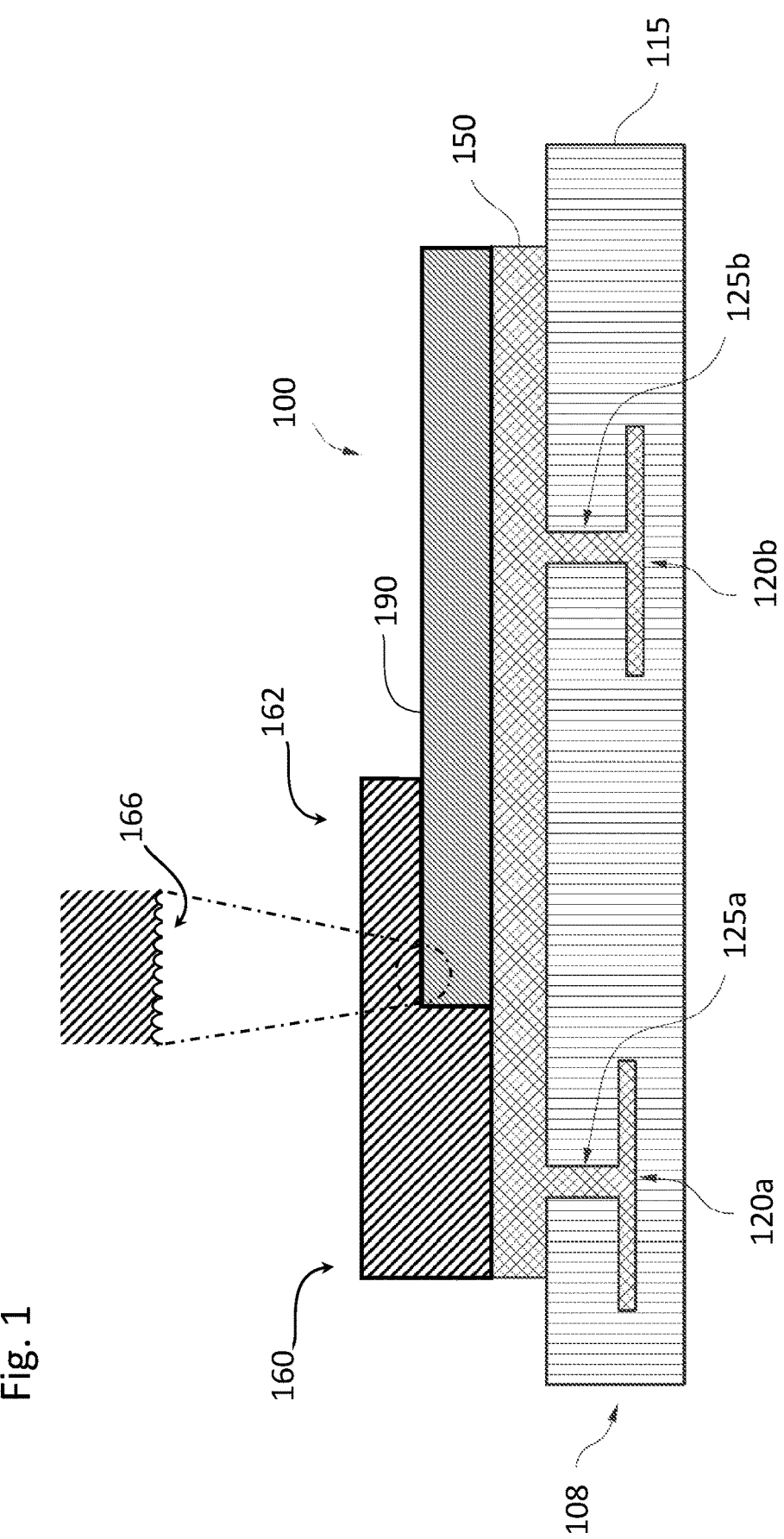
FIG. 1 shows a first embodiment of a component carrier according to the invention.

The aspects defined above and further aspects of the invention are apparent from the examples of embodiment to be described hereinafter and are explained with reference to these examples of embodiment.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

Further, spatially relative terms, such as "front" and "back", "above" and "below", "left" and "right", et cetera are used to describe an element's relationship to another element(s) as illustrated in the figures. Thus, the spatially relative terms may apply to orientations in use which differ from the orientation depicted in the figures. Obviously all such spatially relative terms refer to the orientation shown in the figures only for ease of description and are not necessarily limiting as an apparatus according to an embodiment of the invention can assume orientations different than those illustrated in the figures when in use.

FIG. 1 shows an embodiment of a component carrier according to the invention. The component carrier 100 as shown in FIG. 1 comprises a laminated stack 108. The laminated stack 108 comprises an electrically insulating layer structure 115 with a first portion of an electrically conductive layer structure 120a, 120b extending inside the laminated stack 108 and with a second portion of the electrically conductive layer structure 150 extending on the laminated stack 108 forming an exposed structured copper surface. The electrically conductive layer structure 120a, 120b, 150 is preferably made of copper. The electrically conductive layer structure 120a, 120b inside the laminated stack 108 is connected to the electrically conductive layer structure 150 extending on the laminated stack 108 by vias 125a, 125b.

The component carrier 100 further comprises a first surface finish 160 formed on a first surface portion of the electrically conductive layer structure 150. The first surface finish 160 forms an overhanging end 162. The overhanging end 162 has a roughened surface 166. The component carrier 100 further comprises a second surface finish 190 on a second surface portion of the electrically conductive layer structure 150 connecting to the first surface finish 160 and extending under the overhanging end 162. The electrically conductive layer structure 150 connects to the overhanging end 162 of the first surface finish 160.

Due to the overhanging end 162 of the first surface finish 160, the interaction surface of the first surface finish 160 and the second surface finish 190 is enlarged compared to the case where a first surface finish 160 and a second surface finish 190 are positioned adjacent to each other without any overlap, i.e. a contact being established only in a sideward way. Therefore the inventive architecture with the overhanging end 162 of the first surface finish 160 under which the second surface finish 190 at least partly extents avoids delamination of the first surface finish and the second surface finish, a decomposition and/or delamination and gap formation at the interface of the two surface finishes.

FIG. 2A illustrates a first step of a method according to an embodiment of the invention. A first surface finish 160 on a first surface portion of the electrically conductive layer structure 150 is formed.

FIG. 2B illustrates a further step of a method according to an embodiment of the invention. An overhanging end 162 and a corresponding cavity 264 of the first surface finish 160 is formed by removing material of the first surface finish 160. An etching process allows for the removal of material of the first surface finish 160 resulting in the cavity 264 having a roughened surface 266 which cavity surface being formed by surface portions of the first surface finish 160, and the electrically conductive layer structure 150.

Next, a second surface finish 190 on a second surface portion of the electrically conductive layer structure 150 is formed, which second surface finish 190 is connected to the first surface finish 160 and extending under the overhanging end 162 (see FIG. 1).

The final component carrier 100 (as shown in FIG. 1) obtained by the illustrated method is a component carrier having a second surface finish 190 connecting to a roughened surface 166 resulting from the etching process of the first surface finish 160.

Figure 3:
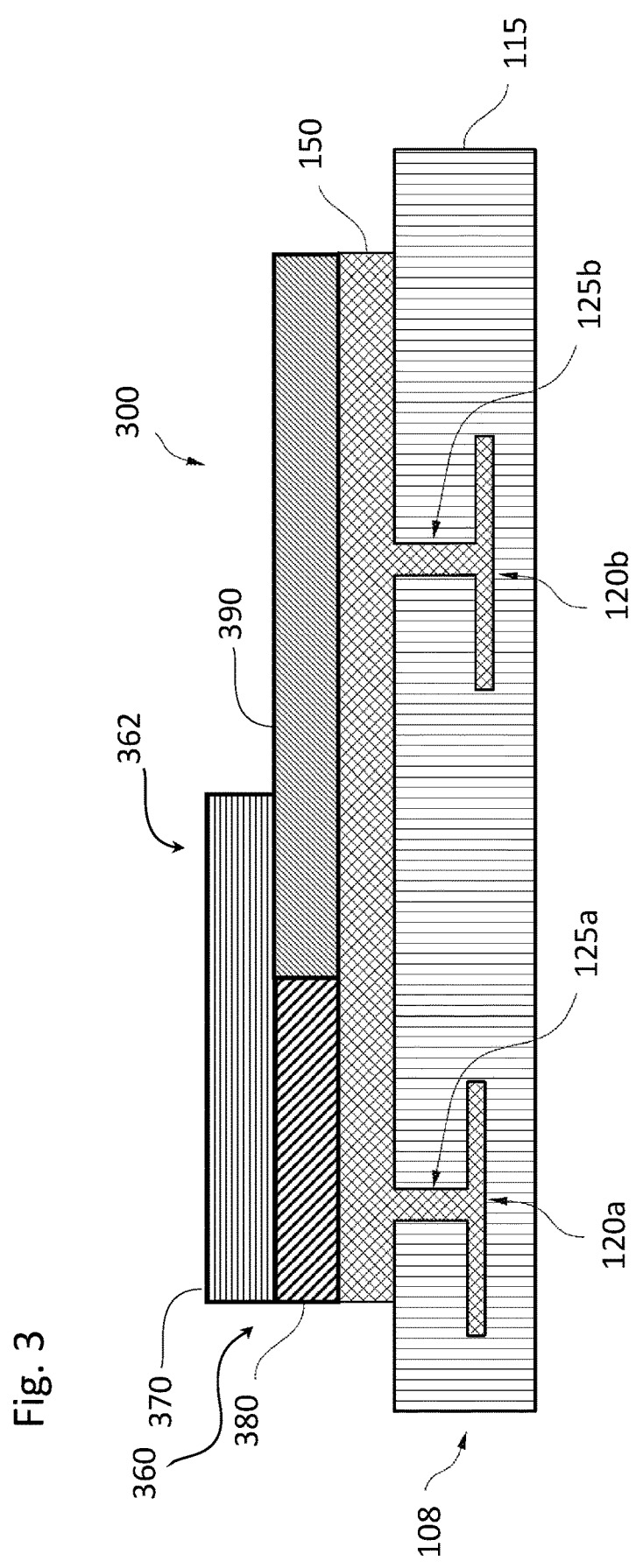
FIG. 3 shows a second embodiment of a component carrier according to the invention.

FIG. 3 shows another embodiment of a component carrier according to the invention. The first surface finish 360 of the component carrier 300 shown in FIG. 3 further comprises a first layer structure 380 arranged above the electrically conductive layer structure 150 and a second layer structure 370 arranged above the first layer structure 380. The second surface finish 390 extends under the overhanging end 362 connecting to surface portions of the second layer structure 370, the first layer structure 380 and the electrically conductive layer structure 150.

FIG. 4A illustrates a first step of a method according to an embodiment of the invention. A first layer structure 380 of a first surface finish 360 is formed on a first surface portion of the electrically conductive layer structure 150 of a method for manufacturing of component carrier 300 as shown in FIG. 3.

FIG. 4B illustrates a further step of a method according to an embodiment of the invention. A second layer structure 370 is formed on the first layer structure 380. Both the first layer structure 380 and the second layer structure 370 form the first surface finish 360.

Figure 4C:
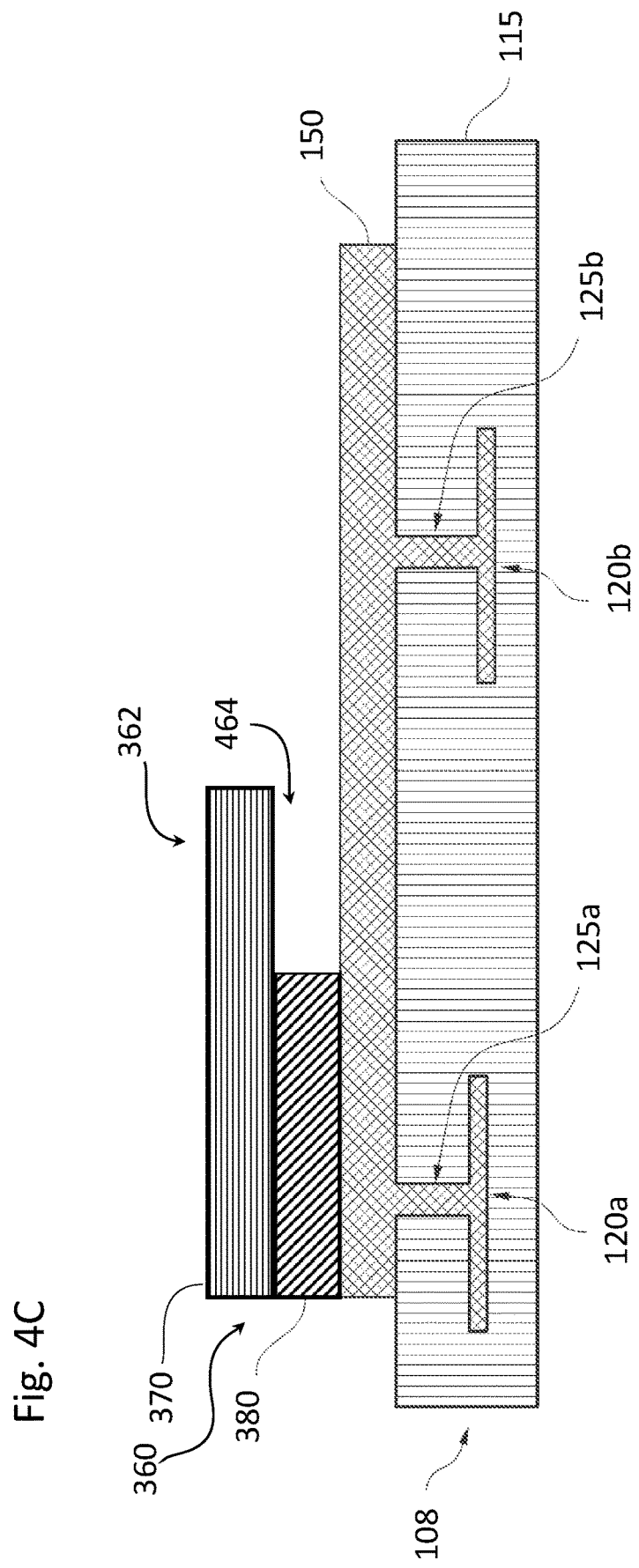

FIG. 4C illustrates a further step of a method according to an embodiment of the invention. An overhanging end 362 and a corresponding cavity 464 are formed by removing material of the first surface finish 360. An etching process allows for a selective removal of material of the first layer structure 380 of the first surface finish 360 while the second layer structure 370 is basically left intact resulting in a cavity 464 with a roughened surface formed by surface portions of the second layer structure 370, the electrically conductive layer structure 150 and the first layer structure 380. The final component carrier 300 (as shown in FIG. 3) is obtained by providing a second surface finish 390 extending under the overhanging end 362 and connecting to the roughened surface resulting from the etching process of the first surface finish 360.

It should be noted that the term "comprising" does not exclude other elements or steps and the use of articles "a" or "an" does not exclude a plurality. Also elements described in association with different embodiments may be combined.

LIST OF REFERENCE SIGNS 100, 300 component carrier
108 laminated stack
115 electrically insulating layer structure
120a, 120b electrically conductive layer structure
125a, 125b electrically conductive layer structure
150 electrically conductive layer structure
160, 360 first surface finish
380 first layer structure
370 second layer structure
162, 362 overhanging end
166 roughened surface/etched surface
190, 390 second surface finish
264, 464 cavity

The invention claimed is:

1. A component carrier, comprising:
   an electrically conductive layer structure with a first portion extending inside a stack of the component carrier and a second portion extending on the stack including an exposed surface;
   a first surface finish formed only on a first surface portion of the exposed surface of the electrically conductive layer structure and having an overhanging end; and
   a second surface finish formed only on a second surface portion of the exposed surface of the electrically conductive layer structure connecting to the first surface finish and extending under the overhanging end.

2. The component carrier according to claim 1, wherein the second surface finish connects to a roughened surface of the first surface finish.

3. The component carrier according to claim 1, wherein the first surface finish comprises:
   a first layer structure arranged above the electrically conductive layer structure; and
   a second layer structure arranged above the first layer structure;

wherein a thickness of the first layer structure is equal to a thickness of the second surface finish.

4. The component carrier according to claim 3, wherein the first layer structure and/or the second layer structure comprise at least one from the group consisting of nickel, palladium, platinum, gold, copper.

5. The component carrier according to claim 4, wherein a chemical composition of the first layer structure and a chemical composition of the second layer structure differ from each other.

6. The component carrier according to claim 1, wherein the first surface finish comprises:
   a first layer structure arranged above the electrically conductive layer structure; and
   a second layer structure arranged above the first layer structure;
   wherein the second layer structure is a homogeneous layer structure arranged directly on the first layer structure, and
   wherein the first layer structure comprises nickel and the second layer structure comprises palladium.

7. The component carrier according to claim 1, wherein the second surface finish comprises at least one from the group consisting of organic solderability preservative component, nickel, palladium, platinum, gold, copper.

8. The component carrier according to claim 7, wherein the organic solderability preservative component is an azole.

9. The component carrier according claim 8, wherein the azole is one from the group consisting of benzotriazoles, imidazoles, benzimidazoles.

10. The component carrier according to claim 1, wherein the electrically conductive layer structure comprises at least one of the group consisting of copper, aluminum, nickel, silver, gold, palladium, and tungsten.

11. The component carrier according to claim 1, wherein the at least one electrically insulating layer structure comprises at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

12. The component carrier according to claim 1, wherein the component carrier is shaped as a plate.

13. The component carrier according to claim 1, wherein the component carrier is configured as one of the group consisting of a printed circuit board, and a substrate.

14. The component carrier according to claim 1, configured as a laminate-type component carrier.

15. A method of manufacturing a component carrier, the method comprising:
    forming a first surface finish only on a first surface portion of an exposed surface of an electrically conductive layer structure;
    forming an overhanging end of the first surface finish by removing material of the first surface finish; and
    forming a second surface finish only on a second surface portion of the exposed surface of the electrically conductive layer structure, wherein the second surface finish is connected to the first surface finish and extends under the overhanging end;
    wherein the electrically conductive layer structure has a first portion extending inside a stack of the component carrier and a second portion extending on the stack including the exposed surface.

16. The method according to claim 15, wherein the removing of material of the first surface finish comprises an etching process.

17. The method according to claim 16, wherein the first surface finish comprises a first layer structure and a second layer structure and wherein the etching process selectively removes material of the first layer structure of the first surface finish.

18. The method according to claim 16, wherein the etching process comprises an application of an etching composition comprising $H_2O_2$ and $H_2SO_4$.

19. A component carrier, comprising:
    an electrically conductive layer structure with a first portion extending inside a stack of the component carrier and a second portion extending on the stack including an exposed surface;
    a first surface finish formed on a first surface portion of the exposed surface of the electrically conductive layer structure and having an overhanging end; and
    a second surface finish on a second surface portion of the exposed surface of the electrically conductive layer structure connecting to the first surface finish and extending under the overhanging end;
    wherein the first portion of the electrically conductive layer structure comprises a first part extending parallel to the exposed surface and a regularly shaped second part connecting the first part with the second portion of the electrically conductive layer structure.

20. The component carrier according to claim 19, wherein the second surface finish connects to an etched surface of the first surface finish.

* * * * *